United States Patent

Christensen et al.

(10) Patent No.: US 9,450,115 B2
(45) Date of Patent: Sep. 20, 2016

(54) METHOD OF MANUFACTURING A PHOTOVOLTAIC DEVICE

(71) Applicant: First Solar, Inc., Perrysburg, OH (US)

(72) Inventors: Scott Christensen, Perrysburg, OH (US); Pawel Mrozek, Waterville, OH (US); Gang Xiong, Santa Clara, CA (US); San Yu, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 14/212,584

(22) Filed: Mar. 14, 2014

(65) Prior Publication Data

US 2014/0273334 A1 Sep. 18, 2014

Related U.S. Application Data

(60) Provisional application No. 61/791,442, filed on Mar. 15, 2013.

(51) Int. Cl.
*H01L 21/00* (2006.01)
*H01L 31/0224* (2006.01)
*H01L 31/0392* (2006.01)
*H01L 31/073* (2012.01)

(52) U.S. Cl.
CPC . *H01L 31/022425* (2013.01); *H01L 31/03925* (2013.01); *H01L 31/073* (2013.01); *Y02E 10/543* (2013.01)

(58) Field of Classification Search
None
See application file for complete search history.

(56) References Cited

U.S. PATENT DOCUMENTS

| 4,319,069 | A | 3/1982 | Tyan | |
|---|---|---|---|---|
| 4,445,965 | A | 5/1984 | Milnes | |
| 4,456,630 | A | 6/1984 | Basol | |
| 5,909,632 | A | 6/1999 | Gessert | |
| 6,494,966 | B2 * | 12/2002 | Chao et al. | 134/26 |
| 7,858,872 | B2 * | 12/2010 | Hotz et al. | 136/238 |
| 7,896,970 | B2 * | 3/2011 | Tomita et al. | 134/1.3 |
| 8,187,963 | B2 | 5/2012 | Basol | |
| 2003/0005881 | A1 * | 1/2003 | Shin | 117/97 |
| 2007/0278626 | A1 * | 12/2007 | Fuchs | H01L 31/0304 257/626 |
| 2011/0061736 | A1 * | 3/2011 | Addepalli et al. | 136/260 |
| 2012/0192948 | A1 * | 8/2012 | Basol | 136/260 |

FOREIGN PATENT DOCUMENTS

JP 2003174007 A * 6/2003 ........... H01L 21/304

OTHER PUBLICATIONS

"Solution." Merriam-Webster.com. Merriam-Webster, n.d. Web. Mar. 14, 2016.*

* cited by examiner

*Primary Examiner* — Reema Patel
(74) *Attorney, Agent, or Firm* — Fraser Clemens Martin & Miller LLC; Michael E. Dockins

(57) ABSTRACT

A method to improve CdTe-based photovoltaic device efficiency is disclosed, the method including steps for removing surface contaminants from a semiconductor absorber layer prior to the deposition or formation of a back contact layer on the semiconductor absorber layer, the surface contaminants removed using at least one of a dry etching process and a wet etching process.

17 Claims, 1 Drawing Sheet

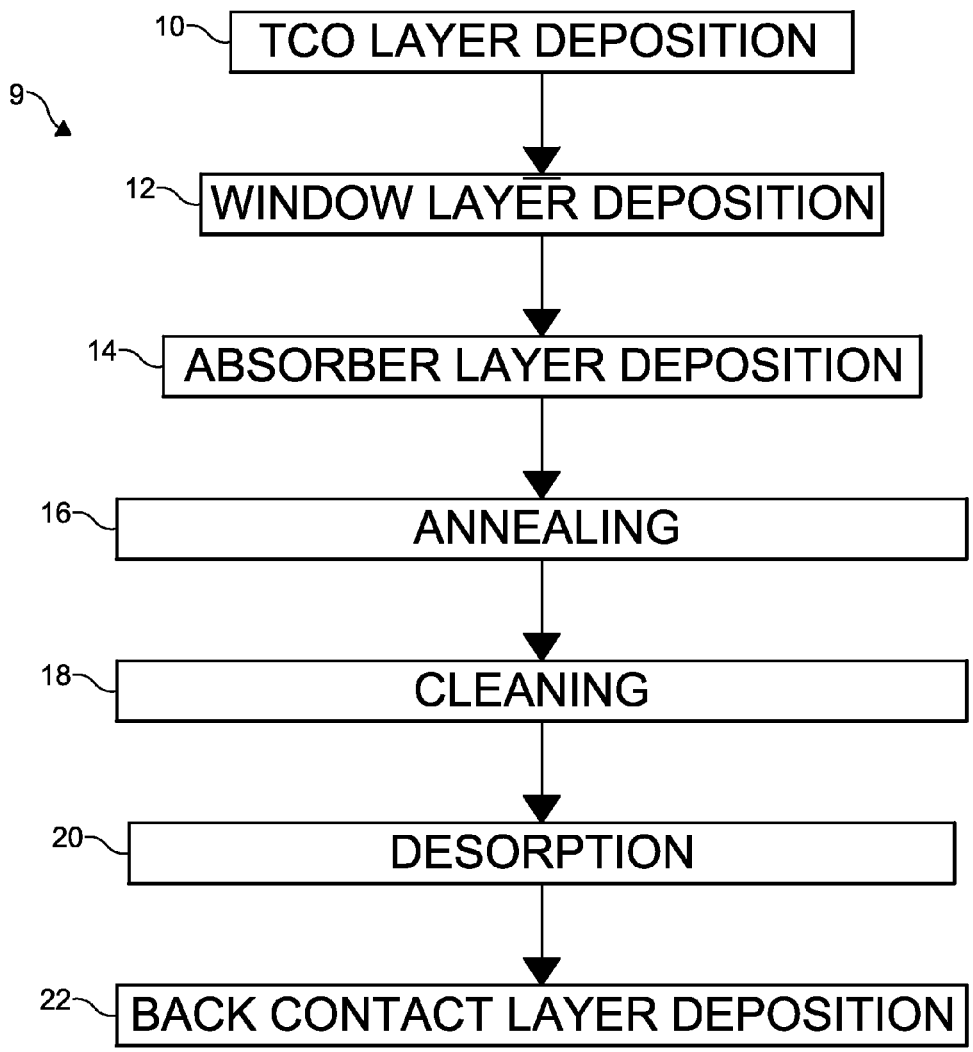

METHOD OF MANUFACTURING A PHOTOVOLTAIC DEVICE

CROSS-REFERENCE TO RELATED APPLICATION

This is application claims the benefit of priority of U.S. Provisional Patent Application Ser. No. 61/791,442 filed on Mar. 15, 2013 hereby incorporated herein by reference in its entirety.

FIELD OF THE INVENTION

The present disclosure relates to a photovoltaic device, and more particularly to a method of preparing a surface of a photovoltaic device prior to deposition of an additional layer to improve an interface therebetween.

BACKGROUND OF THE INVENTION

Photovoltaic modules, devices, or cells, can include multiple layers (or coatings) created on a substrate (or superstrate). For example, a photovoltaic device can include a barrier layer, a transparent conductive oxide layer, a buffer layer, and a semiconductor layer formed in a stack on a substrate. Each layer may in turn include more than one layer or film. For example, a semiconductor window layer and a semiconductor absorber layer together can be considered a semiconductor layer. Additionally, each layer can cover all or a portion of the device and/or all or a portion of a layer or a substrate underlying the layer. For example, a "layer" can include any amount of any material that contacts all or a portion of a surface. Cadmium telluride has been used for the semiconductor layer because of its optimal band structure and a low cost of manufacturing.

In order to electrically connect the photovoltaic device, a back contact layer can also be used. The back contact layer can include an electrically conductive material, such as a metal, deposited onto the semiconductor layer. The back contact material is typically a metal selected for sufficient adhesion to the semiconductor layer and minimal formation of a back contact barrier that can affect the current-voltage characteristics of the photovoltaic device.

Prior to depositing or forming the back contact layer on the semiconductor layer of a photovoltaic device, it may be desirable to remove surface contaminants from the semiconductor layer. Surface contamination includes oxidation of the semiconductor layer, adsorption of hydrocarbon and/or carbonates and/or other organic and inorganic contaminants on the semiconductor layer, for example. Contaminants formed on the semiconductor layer may affect an interface between the semiconductor layer and the back contact layer. A poor interface between the semiconductor layer and the back contact layer may have an undesirable effect on the photovoltaic device, and specifically on $V_{OC}$ and $R_{OC}$. Known methods of removing contaminants from the surface of the semiconductor layer may negatively affect a grain boundary and/or lattice of the crystals forming the semiconductor layer. It would be desirable to develop a more effective method to remove surface contaminants from a semiconductor layer of a photovoltaic device prior to depositing or forming a back contact layer to improve a performance of the photovoltaic device.

SUMMARY OF THE INVENTION

Concordant and congruous with the instant disclosure, a more effective method to remove surface contaminants from an absorber layer of a photovoltaic device prior to depositing or forming a back contact layer to improve a performance of the photovoltaic device has surprisingly been discovered.

In an embodiment of the invention, a method of manufacturing a photovoltaic device comprises the steps of depositing a semiconductor absorber layer adjacent to a substrate; cleaning the semiconductor absorber layer to remove contaminants therefrom; and depositing a back contact layer adjacent to the semiconductor absorber layer.

In another embodiment of the invention, a method of manufacturing a photovoltaic device comprises the steps of depositing a semiconductor absorber layer adjacent to a substrate; cleaning the semiconductor absorber layer to remove contaminants therefrom; removing surface moisture from the semiconductor absorber layer; and depositing a back contact layer adjacent to the semiconductor absorber layer.

In another embodiment of the invention, a method of manufacturing a photovoltaic device comprises the steps of depositing a CdTe semiconductor absorber layer adjacent to a substrate; cleaning the CdTe semiconductor absorber layer to remove contaminants therefrom using a dry etch and/or a wet etch; removing surface moisture from the CdTe semiconductor absorber layer; and depositing a ZnTe back contact layer adjacent to the CdTe semiconductor absorber layer.

DRAWINGS

The above, as well as other advantages of the present disclosure, will become readily apparent to those skilled in the art from the following detailed description, particularly when considered in the light of the drawings described hereafter.

FIG. 1 is a photovoltaic device according to an embodiment of the invention; and FIG. 2 is a flow diagram of a method of preparing a surface of an absorber layer prior to application of a back contact according to an embodiment of the invention.

DETAILED DESCRIPTION OF THE INVENTION

The following description is merely exemplary in nature and is not intended to limit the present disclosure, application, or uses. It should also be understood that throughout the drawings, corresponding reference numerals indicate like or corresponding parts and features. In respect of the methods disclosed, the order of the steps presented is exemplary in nature, and thus, is not necessary or critical unless recited otherwise.

As shown in FIG. 1 the present disclosure includes a photovoltaic device 2. The photovoltaic device 2 has multiple layers including a glass substrate (or superstrate) 4, a semiconductor layer 6 (also referred to as an absorber layer or a semiconductor absorber layer), and a back contact layer 8. For purposes of simplicity in illustrating the invention, only the substrate 4, the semiconductor layer 6, and the back contact layer 8 are shown in the drawings. However, one of ordinary skill in the art should understand that one or more additional layers including, but not limited to, a barrier layer, a transparent conductive oxide layer, a buffer layer, and a semiconductor window layer, formed from the same or different materials, may also be used in the photovoltaic device 2 of the present disclosure.

The substrate 4 of the photovoltaic device 2 is formed of a material that provides rigid support, light transmission, chemical stability and typically includes one of a float glass, soda lime glass, polymer, or other suitable material. The semiconductor layer 6 can include a bi-layer, which may include an n-type semiconductor window layer (e.g., CdS), and a p-type semiconductor absorber layer (e.g., CdTe). Other suitable materials for the semiconductor layer 6 include copper indium sulfide, copper indium gallium diselenide, copper indium gallium diselenide sulfide, and cadmium sulfide, for example.

In order to electrically connect the photovoltaic device 2 to another device or system, the back contact layer 8 is formed from an electrically conductive material, such as polycrystalline zinc telluride (ZnTe). It is understood that the back contact layer 8 may be formed from CdZnTe, ZnTe:Cu, or a multi-layer stack including one or more of CdTe, CdZnTe, ZnTe, and ZnTe:Cu. It is desirable to deposit the polycrystalline ZnTe back contact layer 8 onto the semiconductor layer 6 to optimize a matching of crystallographic characteristics between the back contact layer 8 and the semiconductor layer 6. Accordingly, in one embodiment of the invention, the ZnTe back contact layer 8 is an epitaxial ZnTe layer optimized to have a high degree of epitaxial quality.

FIG. 2 shows a flow diagram of a method of manufacturing a photovoltaic device 9 to improve the efficiency of the photovoltaic device. In a step 10, a transparent conductive oxide (TCO) layer (not shown) is deposited adjacent to the substrate 4. The TCO layer may be formed from cadmium oxide, indium oxide, cadmium indium oxide, cadmium stannate, tin oxide, zinc oxide, and the like, for example, and the TCO layer may be doped with titanium, gallium, tin, yttrium, scandium, niobium, or molybdenum to control a band gap thereof and/or to achieve lower resistivity. The TCO layer may be deposited by a sputtering process or by a reactive sputtering process from a doped target, and the TCO layer may have a thickness in a range from about 100 angstrom to about 4000 angstrom, as desired.

In a step 12, a semiconductor window layer (not shown) is deposited adjacent to the TCO layer. The window layer in an n-type semiconductor window layer formed from cadmium sulfide (CdS), for example. The window layer can be deposited by any suitable deposition method, such as sputtering or vapor transport deposition.

In a step 14, a p-type semiconductor absorber layer 6 is deposited adjacent to the semiconductor window layer. The semiconductor absorber layer can be any suitable absorber material, such as cadmium telluride (CdTe), copper indium sulfide, copper indium gallium diselenide, copper indium gallium diselenide sulfide, or cadmium sulfide, and can be deposited by any suitable method, such as sputtering or vapor transport deposition. The n-type semiconductor window layer and the p-type semiconductor absorber layer 6 may be positioned in contact with one another to create an electric field. Photons can free electron-hole pairs upon making contact with the n-type semiconductor window layer, sending electrons to the n side and holes to the p side. Electrons can flow back to the p side via an external current path. The resulting electron flow provides current, which combined with the resulting voltage from the electric field, creates power. The result is the conversion of photon energy into electric power. During the step 14, a vaporized absorber material is impinged upon the substrate to for the p-type semiconductor absorber layer 6.

In a step 16, the layers of the device 2 undergo a cadmium chloride annealing process to increase grain size of the semiconductor absorber layer 6, thereby further improving device efficiency. Cadmium chloride ($CdCl_2$) vapor may be impinged upon the semiconductor absorber layer 6 using any suitable means, including, for example, physical vapor deposition. The step 16 may occur under any suitable conditions, for example, under any suitable pressure, such as under reduced pressure, or in a vacuum. Once the $CdCl_2$ deposition occurs, the layers of the device 2 are annealed to induce grain growth. The annealing step may occur at a temperature above about 380° C., for example, in a range of about 400° C. to about 800° C., about 500° C. to about 700° C., about 550° C. to about 650° C., more than about 400° C., or less than about 600° C.

In a step 18, the semiconductor absorber layer 6 (or the entire device as formed up to the step 18) undergoes a cleaning step. The cleaning step 18 may include either or both of a dry etching process and a wet etching process. The dry etching process may be a plasma etching process or an ion-sputtering process. A plasma etching process may utilize an oxygen plasma (including either or both ashing and/or descum processes), which has been found effective for removing hydrocarbon and other carbon-containing surface contaminants. Positive results have been found when a CdTe semiconductor absorber layer is exposed to an oxygen plasma etching process for about 10 seconds to about 30 seconds to reduce the carbon levels thereof by about 40%. The oxygen plasma etching step may result in oxidation of the tellurium on the CdTe semiconductor layer.

The dry etching process may be followed or replaced by a wet etching process with an acid to remove oxidation that may be generated by the oxygen plasma etching step. The acid may be an HCl-containing acid (e.g., HCl, $HCl/HNO_3$, $HCl/H_3PO_4$). When the step 18 involves both a wet and a dry etching, the step 18 has been found to improve an interface between the semiconductor layer (e.g., CdTe) and the back contact layer (e.g., ZnTe). It is understood that the solutions used for wet etching processes may be formed with deionized water or purified water as described herein, as desired. Suitable solutions and processes used in a wet etching process are presented in Table 1.

TABLE 1

| Runs | Etching Solution Composition per 100 ml Solution | Cleaning Times | Rinse Times |
|---|---|---|---|
| 8500 ppm HCl | 2.3 ml 37% HCl, 97.7 ml deionized or purified water | 30 sec | 30 sec |
| $HNO_3$/HCl 1 | 1 ml 65% $HNO_3$, 1 ml 37% HCl, 98 ml deionized or purified water | 30 sec | 30 sec |
| $HNO_3$/HCl 2 | 1 ml 65% $HNO_3$, 2 ml 37% HCl, 97 ml deionized or purified water | 30 sec | 30 sec |
| $HNO_3$/HCl 3 | 1 ml 65% $HNO_3$, 3 ml 37% HCl, 96 ml deionized or purified water | 30 sec | 30 sec |
| NP etch 1 | 1 ml 65% $HNO_3$, 71 ml 85% $H_3PO_4$, 29 ml deionized or purified water | 30 sec | 30 sec |
| NP etch 2 | 1 ml 65% $HNO_3$, 71 ml 85% $H_3PO_4$, 29 ml deionized or purified water | 45 sec | 30 sec |
| NP etch 3 | 1 ml 65% $HNO_3$, 71 ml 85% $H_3PO_4$, 29 ml deionized or purified water | 60 sec | 30 sec |

The period of time that the semiconductor absorber layer 6 may be cleaned with the wet etching solution is in a range of about 30 seconds to about 60 seconds. It is understood, however, that the etching solution can be used to clean the absorber layer for any suitable period of time, as desired.

After cleaning with the wet etching solution, the semiconductor absorber layer 6 may be rinsed with water (i.e. purified water or deionized water) for a predetermined period of time. In certain embodiments, the semiconductor absorber layer 6 may be rinsed for about 30 seconds. It is understood that the semiconductor absorber layer 6 can be rinsed with the water for any suitable period of time as desired.

In an embodiment of the invention, the step 18 the semiconductor absorber layer 6 is cleaned using a dry etching process. During the dry etching process, the semiconductor absorber layer 6 is cleaned with an oxygen plasma for about 45 seconds. After the dry etching process, the semiconductor absorber layer 6 is cleaned using a wet etching process, which employs an etching solution having a composition of about 8500 ppm HCl, about 0.09% to about 3.7% HCl, about 0.09% to about 3.7% HCl, 3.7% HCl (10/1 HCl), or an $HNO_3$/HCl mixture. After the wet etching process, the semiconductor absorber layer 6 is rinsed in a rinsing step with either deionized water or purified water (e.g., ultrapure, Type 1 ISO369 water such as that provided under the Milli-Q trademark owned by Millipore water). Positive results have been obtained for the cleaning step 18 employing the wet etching process for about 45 seconds utilizing an HCl-containing etching solution such as a solution of 8500 ppm HCl, about 0.09% to about 3.7% HCl, or 3.7% (10/1) HCl.

In another embodiment of the invention, in the step 18 the semiconductor absorber layer 6 is cleaned using a wet etching process. During the wet etching process, the semiconductor absorber layer 6 is cleaned with an etching solution having a composition of about 8500 ppm HCl, 3.7% HCl (10/1 HCl), about 0.09% to about 3.7% HCl, a two-step process with a $NH_4OH/H_2O_2$ mixture then HCl, an $HNO_3$/HCl mixture, or an $HNO_3/H_3PO_4$ mixture. After the wet etching process, the semiconductor absorber layer 6 is rinsed with one of a deionized water and a purified water (e.g., ultrapure, Type 1 ISO369 water such as that provided under the Milli-Q trademark owned by Millipore water). Using the cleaning step 18 of Example 2, Te oxides were removed from the semiconductor absorber layer 6, and that the semiconductor absorber layer 6 cleaned with the aforementioned etching solutions have substantially equivalent carbon levels with the exception of those cleaned with the $HNO_3/H_3PO_4$ mixture. Further, it has been found that an addition of carbon to the semiconductor absorber layer 6 is not evident when the purified water is used to rinse the absorber layer after the step 18.

In accordance with the embodiments of the invention, it has been found that using $HCl/H_3PO_4$ during the wet etching process results in the semiconductor absorber layer 6 with a Te-rich surface and a low Cd/Te ratio. It has also been found that using HCl on the surface of the semiconductor absorber layer 6 results in a higher Cd/Te ratio. Thus, the stoichiometry of the semiconductor absorber layer 6 may be selectively modified using the wet etch, as desired.

Positive results have been obtained using the cleaning step 18 using one or more of a dry etching process and a wet etching process to remove surface contaminants from the semiconductor absorber layer 6 prior to deposition of the back contact layer 8, resulting in increased efficiencies in PV cells, such as efficiencies exceeding about 17% and about 17.3%, which result in PV devices having increased efficiencies exceeding about 14.3% and about 14.4%

In a step 20, the semiconductor absorber layer 6 undergoes a desorption step. The desorption step 20 may include a step of applying thermal energy to the photovoltaic device 2 as formed through the step 18, known as a thermal bake procedure. The step 20 may include desorbing moisture by placing the photovoltaic device 2 within an enclosure and placing the enclosure photovoltaic device 2 under vacuum to cause removal of the surface moisture from the semiconductor absorber layer 6, or by causing a vacuum pump to contact or be placed over the semiconductor absorber layer 6 to remove the surface moisture the semiconductor absorber layer 6.

In a step 22, a back contact layer 8 formed from a metal is deposited adjacent the semiconductor absorber layer 6. The back contact layer 8 may be formed from polycrystalline ZnTe; ZnTe:Cu, and a multilayer-stack having a combination of at least two of the following: CdTe, CdZnTe, and ZnTe; CdZnTe; and ZnTe:Cu, or the like, for example. A back support (not shown) may be deposited onto the back contact, the back support formed from a glass or a soda-lime glass, for example.

Because surface contaminants of the semiconductor absorber layer 6 are removed using the cleaning step 18 prior to the step 22 to deposit or form the back contact layer 8 thereon, surface contaminants on the semiconductor absorber layer 6 are minimized, thereby minimizing contamination (e.g., oxidation, adsorption of hydrocarbon, carbonates, and/or other organic and inorganic contaminants) at the interface of the semiconductor absorber layer 6 and the back contact layer 8. Furthermore, the cleaning step 18 is beneficial in altering a surface stoichiometry of the semiconductor absorber layer 6 to give a Te-rich surface and a low Cd/Te ratio. It is noted that the foregoing cleaning solutions utilizing a HCl-containing acid (e.g., HCl, HCl/$HNO_3$, $HCl/H_3PO_4$) may result in a higher Cd/Te ratio at the surface of the semiconductor absorber layer 6. Using the step 18, the semiconductor absorber layer 6 may be cleaned prior to deposition of the back contact layer 8 with minimized undesired lattice affects. The step 18 also results in minimized undesired grain boundary affects between the semiconductor absorber layer 6 and the back contact layer 8. By minimizing the contamination at the interface of the semiconductor absorber layer 6 and the back contact layer 8, better contact is made between the semiconductor absorber layer 6 and the back contact layer 8, thereby providing better and more efficient electrical contact therebetween and resulting in an improved and more efficient photovoltaic device 2.

While certain representative embodiments and details have been shown for purposes of illustrating the invention, it will be apparent to those skilled in the art that various changes may be made without departing from the scope of the disclosure, which is further described in the following appended claims.

What is claimed is:

1. A method of manufacturing a photovoltaic device comprising the steps of:
   depositing a semiconductor absorber layer adjacent to a substrate;
   cleaning the semiconductor absorber layer to remove contaminants therefrom using in succession a dry etch followed by a wet etch, the wet etch performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl;
   in a desorption step, placing the semiconductor layer and the substrate in a vacuum and applying thermal energy to remove surface moisture from the semiconductor absorber layer; and depositing a back contact layer adjacent to the semiconductor absorber layer;

wherein the cleaning the semiconductor absorber layer step and the desorption step are performed prior to the deposition of the back contact layer.

2. The method of claim 1, wherein the back contact layer is formed from one of the group of a polycrystalline zinc telluride, ZnTe:Cu, CdZnTe, and a multi-layer stack including at least two of CdTe, CdZnTe, ZnTe, and ZnTe:Cu.

3. The method of claim 1, wherein the wet etch is performed using an HCl-containing solution chosen from a list consisting of a solution having about 8500 ppm HCl, about 0.09% to about 3.7% HCl, about 0.09% to about 3.7% HCl, 3.7% HCl (10/1 HCl), a two-step wet etch with a $NH_4OH/H_2O_2$ mixture and HCl, and an $HNO_3/HCl$ mixture.

4. The method of claim 1, wherein the dry etch utilizes an oxygen plasma etching process removes hydrocarbons and other carbon-containing contaminants from the semiconductor absorber layer.

5. The method of claim 4, wherein the wet etch of the semiconductor absorber layer removes oxidized material utilizing a HCl-containing solution.

6. The method of claim 4, further comprising a step of rinsing the semiconductor absorber layer after the cleaning step with one of the group of a deionized water and a purified water.

7. The method of claim 6, further comprising a step of removing surface moisture from the semiconductor absorber layer prior to the depositing of the back contact layer step.

8. The method of claim 1, wherein the wet etch is performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl at about 0.09% to about 3.7% HCl.

9. A method of manufacturing a photovoltaic device comprising the steps of:

depositing a semiconductor absorber layer adjacent to a substrate;

cleaning the semiconductor absorber layer to remove contaminants therefrom using a dry etch of the semiconductor absorber layer followed in succession by a wet etch of the semiconductor absorber layer, the wet etch performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl;

in a desorption step, placing the semiconductor layer and the substrate in a vacuum and applying thermal energy to remove surface moisture from the semiconductor absorber layer after the cleaning step; and depositing a back contact layer adjacent to the semiconductor absorber layer.

10. The method of claim 9, wherein the back contact layer is formed from one of the group of a polycrystalline zinc telluride, ZnTe:Cu, CdZnTe, and a multi-layer stack including at least two of CdTe, CdZnTe, ZnTe, and ZnTe:Cu.

11. The method of claim 9, wherein the wet etch is performed using an HCl-containing solution chosen from a list consisting of a solution having about 8500 ppm HCl, about 0.09% to about 3.7% HCl, 3.7% HCl (10/1 HCl), a two-step wet etch with a $NH_4OH/H_2O_2$ mixture and HCl, and an $HNO_3/HCl$ mixture.

12. The method of claim 9, wherein the dry etch utilizes an oxygen plasma etching process removing hydrocarbons and other carbon-containing contaminants from the semiconductor absorber layer.

13. The method of claim 9, further comprising the step of rinsing the semiconductor absorber layer after the cleaning step with one of the group of a deionized water and a purified water.

14. The method of claim 9, wherein the wet etch is performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl at about 0.09% to about 3.7% HCl.

15. A method of manufacturing a photovoltaic device comprising the steps of:

depositing a CdTe semiconductor absorber layer adjacent to a substrate;

cleaning the CdTe semiconductor absorber layer to remove contaminants therefrom using a dry etch followed in succession by a wet etch, the wet etch performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl;

in a desorption step, placing the semiconductor layer and the substrate in a vacuum and applying thermal energy to remove surface moisture from the CdTe semiconductor absorber layer; and depositing a ZnTe back contact layer adjacent to the CdTe semiconductor absorber layer.

16. The method of claim 15, wherein the dry etch utilizes an oxygen plasma etching process removes hydrocarbons and other carbon-containing contaminants from the semiconductor absorber layer and the wet etch utilizes a HCl-containing solution chosen from a list consisting of a solution having about 8500 ppm HCl, about 0.09% to about 3.7% HCl, 3.7% HCl (10/1 HCl), a two-step wet etch with a $NH_4OH/H_2O_2$ mixture and HCl, an $HNO_3/HCl$ mixture, and an $HCl/H_3PO_4$ mixture.

17. The method of claim 15, wherein the wet etch is performed using a solution including $HCl/H_3PO_4$ that results in the semiconductor absorber layer having a Te-rich surface and a Cd/Te ratio that is lower than the Cd/Te ratio obtained when the wet etch is performed using a solution including only HCl at about 0.09% to about 3.7% HCl.

* * * * *